United States Patent
Nashimoto

[11] Patent Number: 5,525,434
[45] Date of Patent: Jun. 11, 1996

[54] ORIENTED MULTI-LAYER THIN FILM OF FERRODIELECTRIC SUBSTANCE AND METHOD OF PRODUCING THE SAME

[75] Inventor: Keiichi Nashimoto, Kanagawa, Japan

[73] Assignee: Fuji Xerox Co., Ltd., Tokyo, Japan

[21] Appl. No.: 73,385

[22] Filed: Jun. 9, 1993

[30] Foreign Application Priority Data

Jun. 10, 1992 [JP] Japan ................................ 4-175015

[51] Int. Cl.$^6$ ................................ G11B 5/66; B32B 9/00
[52] U.S. Cl. .............. 428/692; 428/693; 428/694 R; 428/694 SC; 428/694 XS; 428/694 T; 428/694 TM; 428/900
[58] Field of Search .............................. 428/692, 693, 428/694 R, 694 SC, 694 XS, 694 T, 694 TM, 900

[56] References Cited

FOREIGN PATENT DOCUMENTS 62-27482  6/1987  Japan .

OTHER PUBLICATIONS

"Epitaxial LiNbO$_3$ thin films prepared by a sol-gel process", Nashimoto, K. and Cima, M. J., Materials Letters, vol. 10, No. 7, 8, pp. 348–354, Jan. 1991.

Primary Examiner—Leszek Kiliman
Attorney, Agent, or Firm—Finnegan, Henderson, Farabow, Garrett & Dunner

[57] ABSTRACT

Disclosed is an oriented multi-layer ferrodielectric substance thin film which comprises: a first ferrodielectric substance layer of oriented crystals formed on a monocrystal substrate, the first ferrodielectric substance layer having a surface which is high in density and which is high in refractive index equivalently to that of a monocrystal but which is not smooth optically; and a second ferrodielectric substance layer of oriented crystals formed on the first ferrodielectric substance layer, the second ferrodielectric substance layer having a surface which is lower in density than the first ferrodielectric substance layer and which is lower in refractive index than a monocrystal but which is smooth optically. Further disclosed is a method of producing the above oriented multi-layer ferrodielectric substance thin film which comprises the steps of: applying a solution of organic metal compound onto a monocrystal substrate; applying heat treatment onto the monocrystal substrate covered with the solution of organic metal compound; and repeating the above steps of application of the organic metal compound solution and application of heat treatment by a plurality of times, the repetition of heat treatment being carried out at temperatures different from each other.

5 Claims, 1 Drawing Sheet

ORIENTED MULTI-LAYER THIN FILM OF FERRODIELECTRIC SUBSTANCE AND METHOD OF PRODUCING THE SAME

BACKGROUND OF THE INVENTION

The present invention generally relates to a ferrodielectric substance thin film. The present invention particularly relates to a ferrodielectric substance thin film which is formed on a monocrystal substrate by use of the hydrolysis of an organic metal compound, which has a surface optically smooth and transparent, and which has orientation property so that it can be used as an optical element, and relates to a method of producing such a ferrodielectric substance thin film.

Thin films of ferrodielectric substance have various characteristics proper to ferrodielectric substances, such as ferrodielectricity, piezoelectricity, pyroelectricity, electro-optic effects, and so on so that it has been intended to apply ferrodielectric substance thin films to nonvolatile memories, surface elastic wave elements, infrared-ray pyroelectric elements, acoustooptic elements, electro-optic elements, and so on. Of those applications, for the application to electro-optic elements having a thin film optical waveguide structure, such as secondary higher harmonic elements, optical modulation elements, and so on, it is necessary to reduce losses of light and improve characteristics correspondingly to those of a monocrystal, so that it is inevitable to produce a monocrystal thin film. It has been therefore general to form an epitaxial ferrodielectric substance thin film of $BaTiO_3$, $PbTiO_3$ $Pb_{1-x}La_x(Zr_{1-y}Ti_y)_{1-x/4}O_3(PLZT)$, $LiNbO_3$, $KNbO_3$, $Bi_4Ti_3O_{12}$, $Sr_{1-x}Ba_xNb_2O_2$, etc. onto an oxide monocrystal substrate by a method such as rf-magnetron sputtering, ion beam sputtering, pulsed laser deposition, MOCVD, etc. However, each of these methods has problems on control of compositions or surface characteristics of a thin film as well as high cost of the equipments, and comparative high temperature not lower than 500° C. is required as temperature of growth.

There is also a method of obtaining a ferrodielectric substance thin film with an organic metal compound by use of hydrolysis thereof, as disclosed in Japanese Patent Examined Publication No. Sho 62-27482. In this method, there are advantages from various views such as accurate control of chemical compositions, uniform level of molecules, lowered temperature in the process, large area of an element, low o cost of equipments, and so on. However, only a multicrystal thin film of a low density (refer to FIG. 1) can be obtained if baking is performed at high temperature, so that the physical property based on the polarization of a ferrodielectric substance cannot be utilized enough, and scattering of light due to grain boundaries and pin holes is so large that it cannot be used as an optical waveguide or the like. In FIG. 1, the reference numeral 1 represents a monocrystal substrate, and 4 represents a multicrystal thin film.

The present inventor has found that a monocrystal ferrodielectric substance thin film can be formed on a monocrystal substrate by epitaxial growth if an organic metal compound which is not hydrolytic is used (K. Nashimoto and M. J. Cima: "Epitaxial LiNbO₃ Thin Films Prepared by a Sol-Gel Process", Mater. Lett., 10, 7, 8 (1991) 348.).

However, according to this method, a ferrodielectric substance thin film baked at a temperature of about 400° C. seems a monocrystal and has an optically smooth surface, but includes minute holes of diameter of several nm, so that the density is not enough high, and the refractive index is not equivalent to that of a monocrystal. A ferrodielectric substance thin film baked at a temperature of about 700° C. is like a monocrystal and has an extremely large sub-grain structure (a grain-like structure, but the directions of respective grains are almost or perfectly constant (refer to FIG. 2)) in comparison with a multicrystal film or an oriented film, and has a density which is high and a refractive index which is equivalent to a monocrystal, but the surface is not smooth optically because of the sub-grain structure, and the transparency of the film is low. In FIG. 2, the reference numeral 1 represents a monocrystal substrate, and 2 represents an epitaxial ferrodielectric substance layer having a sub-grain structure obtained by high temperature baking.

SUMMARY OF THE INVENTION

It is therefore an object of the present invention to solve the foregoing problems in the prior art.

It is another object of the present invention to provide a ferrodielectric substance thin film which is formed by use of the hydrolysis of an organic metal compound, which has a surface optically smooth and transparent, and which has orientation property so that it can be used as an optical element using an optical waveguide or the like, and to provide a method of producing such a ferrodielectric substance thin film.

In order to attain the above objects, according to an aspect of the present invention, the oriented multi-layer ferrodielectric substance thin film which comprises: a first ferrodielectric substance layer of oriented crystals formed on a monocrystal substrate, the first ferrodielectric substance layer having a surface which is high in density and which is equivalent in refractive index to that of a monocrystal but which is not smooth optically; and a second ferrodielectric substance layer of oriented crystals formed on the first ferrodielectric substance layer, the second ferrodielectric substance layer having a surface which is lower in density than the first ferrodielectric substance layer and which is lower in refractive index than a monocrystal but which is smooth optically.

According to another aspect of the present invention, the method of producing the above oriented multi-layer ferrodielectric substance thin film comprises the steps of: applying a solution of organic metal compound onto a monocrystal substrate; applying heat treatment onto the monocrystal substrate covered with the solution of organic metal compound; and repeating the above steps of application of the organic metal compound solution and application of heat treatment by a plurality of times, the repetition of heat treatment being carried out at temperatures different from each other.

DETAILED DESCRIPTION OF THE PREFERRED EMBODIMENTS

Figure 1:
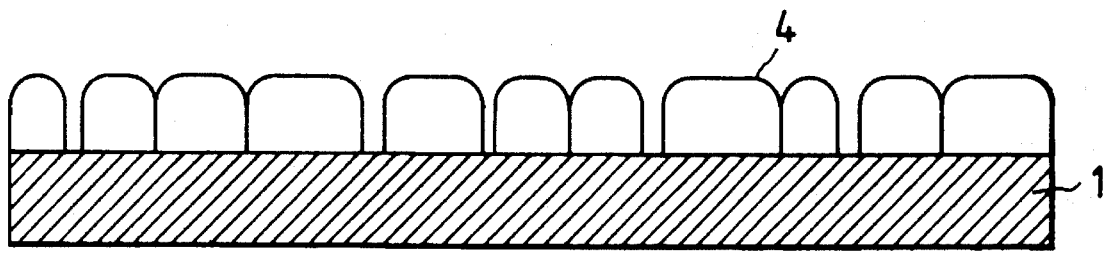
FIG. 1 is a schematic sectional view for explaining the state in which a multicrystal thin film of a low density is formed on a monocrystal substrate by high temperature baking.
Figure 2:
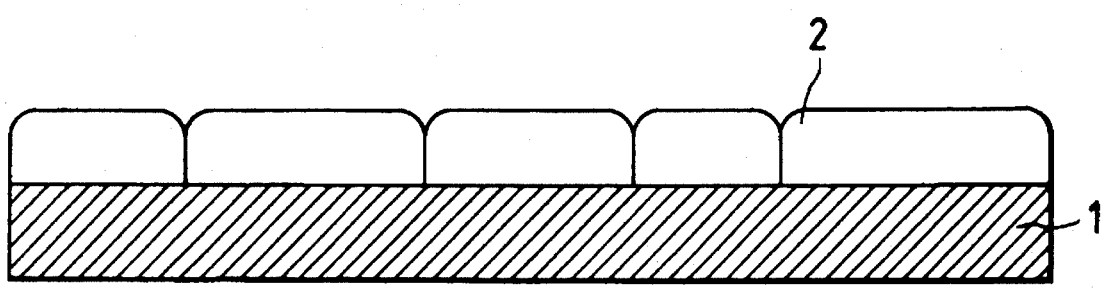
FIG. 2 is a schematic sectional view for explaining the state in which an epitaxial dielectric substance layer is formed on a monocrystal substrate by high temperature baking.
Figure 3:
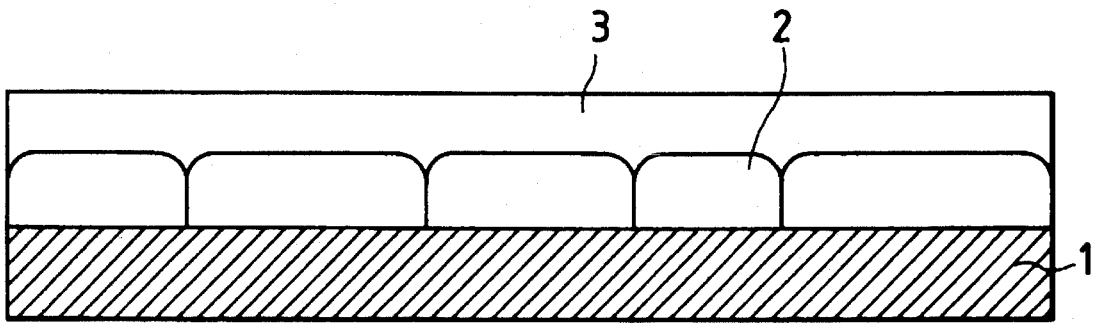
FIG. 3 is a schematic sectional view of an oriented multi-layer ferrodielectric substance thin film according to the present invention having two epitaxial ferrodielectric substance layers formed on a monocrystal substrate by high temperature baking and low temperature baking.

FIG. 3 is a schematic sectional view for explaining the structure of an oriented multi-layer ferrodielectric substance thin film according to the present invention. An oriented multi-layer ferrodielectric substance thin film according to the present invention is constituted by an epitaxial ferrodielectric substance layer 2 having a sub-grain structure formed on a monocrystal substrate 1 by high temperature baking, and an epitaxial ferrodielectric substance layer 3 formed over the epitaxial ferrodielectric substance layer 2 by low temperature baking, the epitaxial ferrodielectric substance layer 3 having an optically smooth surface.

In the oriented multi-layer ferrodielectric substance thin film according to the present invention, it is preferable to use a monocrystal substrate selected from sapphire, spinel, MgO, ZnO, and SrTiO$_3$.

Further, the first and second ferrodielectric substance layers may be constituted by ferrodielectric substances of one and the same composition, or ferrodielectric substances different in composition from each other. Examples of usable ferrodielectric substances are LiNbO$_3$, LiTaO$_3$, KNbO$_3$, BaTiO$_3$, PbTiO$_3$, Bi$_4$Ti$_3$O$_{12}$, and substituent derivatives thereof.

Next, the method of producing the oriented multi-layer ferrodielectric substance thin layer according to the present invention will be described.

An organic metal compound used as a raw material is selected from metal alkoxides and metallic salts of Li, K, Nb, Ta, Bi, Ba, Sr, Pb, La, Ti, Zr, and so on. These raw materials are prepared to a predetermined composition, dissolved in an organic solvent selected from alcohols, diketones, ketoneacids, alkyl esters, oxyacids, oxyketones, and so on, and thereafter the obtained solution is applied onto a substrate. In that case, the organic metal compound in the solution is hydrolyzed before application onto the substrate and/or during heat treatment after application. It is preferable to use a solution which is not hydrolyzed before application.

The above-mentioned solvent of an organic metal compound is coated on the above-mentioned monocrystal substrate, and the coating can be performed by a coating method selected from a spin coat method, a dipping method, a spray method, a screen printing method and an ink jet method.

Next, the organic metal compound applied on the monocrystal substrate is subjected to heat treatment. According to the present invention, it is necessary that the above-mentioned application of the organic metal compound and the heat treatment are repeated two times or more, the heat treatment being carried out while the temperature is varied.

In a preferable mode in the present invention, the above-mentioned solution of the organic metal compound is applied onto the monocrystal substrate, and then baked in a temperature range of from 400° to 1,000° C. so that a first ferrodielectric substance layer is epitaxially grown up in the form of a monocrystal. This application and baking may be further repeated once or more predetermined number of times to thereby form ferrodielectric substance layers from the first layer to a predetermined layer (these layers are generally referred to as "the first ferrodielectric substance layer" herein).

Next, application and baking are performed in the same manner but under the condition of a baking temperature range of from 200° to 600° C., which is lower than the baking temperature of the first layer, so that a second ferrodielectric substance layer is formed. This application and baking may be further repeated once or more predetermined number of times to thereby form ferrodielectric substance layers from the above predetermined layer to the surface layer (these layers are generally referred to as "the second ferrodielectric substance layer" herein). By this, a smoothed ferrodielectric substance thin film surface is formed. According to the present invention, in the case of performing these bakings, heating as pre-treatment may be performed in a temperature range of from 100° to 400° C. in which the thin film is not crystallized.

By the above method, according to the present invention, a ferrodielectric substance multi-layer film having monocrystal-like orientation can be obtained on a monocrystal substrate.

According to the present invention, it is preferable to perform heat treatment in an oxygen atmosphere. In this case, it is preferable to carry out moisture treatment in order to accelerate hydrolysis during baking, while moisture treatment is not always required.

If the first and second layers are formed of ferrodielectric substances of one and the same composition, the oriented multi-layer ferrodielectric substance thin film according to the present invention is constituted by a first layer obtained at a high temperature, having a film density which is high and a refractive index which is equivalent to that of a monocrystal, and having a sub-grain structure, and a second layer obtained at a low temperature, having a comparatively low density and a comparatively low refractive index, but having an optically smooth surface (refer to FIG. 3). In the case where the first and second layers are ferrodielectric substances different in composition, the oriented multi-layer ferrodielectric substance thin film is constituted by a first layer obtained at a high temperature, having a density which is high and a refractive index which is equivalent to that of a monocrystal, and having a sub-grain structure, and a second layer obtained at a low temperature, which is comparatively low in density but equivalent in refractive index to that of the first layer, and which has an optically smooth surface.

(Embodiment 1)

LiOC$_2$H$_5$ (99.9%) and Nb(OC$_2$H$_5$)$_5$ (99.999%) of the same mole quantity were dissolved in ethanol dehydrated by a molecular sieve so that a 0.05M solution was prepared. This solution was stirred and refluxed for 24 hours at 78.5° C. so that double alkoxide Li[Nb(OC$_2$H$_5$)$_6$] having a precursor structure of LiNbO$_3$ was formed. This formation of double alkoxide is important for control of composition ratio Li/Nb=1/1 and for uniform level of molecules.

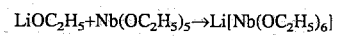

$$LiOC_2H_5 + Nb(OC_2H_5)_5 \rightarrow Li[Nb(OC_2H_5)_6]$$

Then, the obtained solution was condensed by pressure reduction at room temperature so as to prepare a 0.5M solution, and this 0.5M solution was filtrated by a filter of 0.1 µm so as to prepare a precursor solution for spin coating. All the above-mentioned operations were performed in an N$_2$ atmosphere.

Spin coating was performed on the above-mentioned precursor solution at 2,000 rpm in an N$_2$ atmosphere at room temperature by use of a sapphire [(a-Al$_2$O$_3$) (110) and (001)] substrate of 15×15 mm$^2$. Before the spin coating, the sapphire substrate was cleansed by ultrasonic waves in acetone, etched with HCl of 20 volume %, and rinsed with deionized water. Next, the spin-coated substrate was dried at 120° C.

The above-mentioned spin-coated substrate was subjected to bubbling at a rate of 2.0 L/minute in deionized water at room temperature, and held for 60 minutes at 700° C. in a moistured $O_2$ atmosphere after raising the temperature at a rate of 10° C./minute. The above-mentioned moisture treatment onto $O_2$ is effective for hydrolysis during baking of a spin-coating film. After the atmosphere was switched into dried $O_2$ and the substrate was held for 30 minutes, the power source of the electric furnace was turned off, and the substrate was cooled. A first ferrodielectric substance layer was thus formed on the monocrystal substrate so that the layer was high in density and equivalent in refractive index to a monocrystal because the layer had monocrystal-like orientation and a sub-grain structure.

In the above-mentioned case, $H_2O$ was not added to the above-mentioned precursor solution. When baking was performed by use of this precursor having no $H_2O$ and being not hydrolytic, a $LiNbO_3$ thin film was epitaxially grown up at a low temperature of 400° C. It was confirmed that even after grain growth, this epitaxial $LiNbO_3$ film had an extremely large sub-grain structure and a high density in comparison with a multicrystal film or an oriented film, showed a high refractive index in comparison with multicrystal film or an oriented film, and was transparent.

Next, the same precursor solution as mentioned above was applied onto the above-mentioned first ferrodielectric substance layer by spin coating. At that time, the roughness of the sub-grain structure in the surface of the first ferrodielectric substance layer was eliminated by the flattening effect of spin coating so that the surface became extremely smooth. This spin-coated substrate was held for 60 minutes at 400° C. in a moistured $O_2$ atmosphere after raising the temperature at a rate of 10° C./minute. After the atmosphere was switched into dried $O_2$ and the substrate was held for 30 minutes, the power source of the electric furnace was turned off, and the substrate was cooled. By this low temperature baking, a second ferrodielectric substance layer was thus formed so that the second layer had a comparatively low density and a comparatively low refractive index, but had monocrystal-like orientation and an optically smooth substrate.

The monocrystal-like $LiNbO_3$ thin film thus obtained had a refractive index and an optical transmission factor in the visible light range which were equivalent to those of a monocrystal.

(Comparative 1)

A precursor solution prepared in the same manner as in Embodiment 1 was used for coating. The temperature of baking was fixed to 400° C. or 700° C. to form a thin film.

As a result, a mono-layer $LiNbO_3$ thin film formed by baking only at the temperature of 400° C. was like a monocrystal, and had optically smooth and transparent surface. But the thin film contained minute holes each having a diameter of several nm, so that the density was not enough high, and the refractive index was not equivalent to that of a monocrystal. A mono-layer $LiNbO_3$ thin film formed by baking at only temperature 700° C. was like a monocrystal, and had a density which is and a refractive index which is equivalent to that of a monocrystal, but had a surface which was not optically smooth because the thin film had a sub-grain structure and the film was not so transparent as a monocrystal.

(Embodiment 2)

A multi-layer $PbTiO_3$(PT) thin film was obtained as another example.

First, $Pb(CH_3COO)_2$ was dissolved in $CH_3OCH_2CH_2OH$, and thereafter boiled for 30 minutes (120° C.) so as to perform dehydration and partial substitution of $CH_3COO-$ by $CH_3OCH_2CH_2-$ so that a first solution was prepared. $Ti(O-i-C_3H_7)_4$ was dissolved in $CH_3OCH_2CH_2OH$ in room temperature, and boiled for 30 minutes so as to make replacement reaction between $i-C_3H_7OH$ and $CH_3OCH_2CH_2OH$, so that a second solution was prepared. Thereafter, these first and second solutions were mixed, and boiled for 60 minutes so as to form a metal complex $PbTiO_2(OCH_2CH_2OCH_3)_2$, and remove $CH_3COOOCH_2CH_2OCH_3$ a the same time to thereby prepare a solution. A $CH_3OCH_2CH_2OH$ solution of $H_2O:HNO_3$ was added to the thus prepared solution so as to make $Pb:H_2O:HNO_3=1:1:0.01$, and refluxed at 120° C. Consequently, metal alkoxide was hydrolyzed partially. Thereafter, the solution was condensed by pressure reduction so as to finally obtain a precursor solution of 0.5M in Pb concentration. All the above-mentioned operations were performed in an $N_2$ atmosphere.

The obtained precursor solution was applied by spin-coating at 2,500 rpm in an $N_2$ atmosphere at room temperature onto a $SrTiO_3$(100) substrate cleansed and etched in the same manner as in the above-mentioned Embodiment 1. The spin-coated substrate was heated for 5 minutes at 350° C. in an $O_2$ atmosphere to thereby perform thermal decomposition of the thin film. After this process was repeated four times, the substrate was heated for 30 minutes at 650° C. so that the thin film was crystallized, through epitaxial growth in c-axial orientation, into the form of a perovskite single layer. A first ferrodielectric substance layer was thus formed on the monocrystal substrate so that the layer had monocrystal-like orientation and a sub-grain structure, had a density which is high and a refractive index which is equivalent to that of a monocrystal.

Next, the same precursor solution as mentioned above was applied onto the above-mentioned first ferrodielectric substance layer by spin coating. At that time, the roughness of the sub-grain structure in the surface of the first ferrodielectric substance layer was averaged by the flattening effect of spin coating, so that the surface became extremely smooth. This substrate was held for 30 minutes at 450° C. in an $O_2$ atmosphere. A second ferrodielectric substance layer was thus formed by this low temperature baking so that the second layer had a comparatively low density and a low refractive index, but had monocrystal-like orientation and an optically smooth surface.

(Embodiment 3)

As a further example of the present invention, precursor solutions of PT and $Pb(Zr_{0.53}Ti_{0.47})O_3$(PZT) were prepared by use of $Pb(CH_3COO)_2$, $Zr(O-i-C_3H_7)_4$, and $Ti(O-i-C_3H_7)_4$ substantially the same manner as mentioned above.

The above-mentioned PZT precursor solution was applied by spin coating at 2,500 rpm in an $N_2$ atmosphere at room temperature onto a $SrTiO_3$(100) substrate cleansed and etched in the same manner as in the above-mentioned Embodiment 1. The spin-coated substrate was heated for 5 minutes at 350° C. in an $O_2$ atmosphere to thereby perform thermal decomposition of the thin film. After this process was repeated four times, the substrate was heated for 30 minutes at 650° C. so that the PZT thin film was crystallized through epitaxial growth in c-axial orientation into a perovskite single layer. Consequently, a multi-layer PT/PZT thin film which was like a monocrystal and which had a uniform refractive index was obtained.

Next, the PT precursor solution was applied through spin coating onto the above-mentioned PZT thin film, and heated for 5 minutes at 350° C. in an $O_2$ atmosphere so that the thin film was subjected to thermal decomposition. Next, this substrate was heated for 30 minutes at 500° C. so that the thin film was crystallized through epitaxial growth in c-axial orientation into a perovskite single layer. Consequently, a multi-layer PT/PZT thin film which was like a monocrystal and which had a uniform refractive index was obtained. In this case, the PZT layer formed by high temperature baking has high refractive index of 2.47, and on the other hand, the PT layer which should show a refractive index of about 2.60 had a refractive index of 2.45 and an optically smooth surface since it was formed by low temperature baking.

According to the present invention, as has been described, processes of applying a solution of an organic metal compound onto a monocrystal substrate and giving heat treatment thereto are repeated at different temperatures to thereby form a plurality of ferrodielectric substance layers having different minute structures, so that the thus obtained oriented multi-layer ferrodielectric substance film has an optically smooth and transparent surface, a high refractive index, and orientation, so that the thin film may be used as an electro-optic element using an optical waveguide or the like, and other optical elements.

Further, according to the present invention, an oriented multi-layer ferrodielectric substance thin film is formed with a solution of an organic metal compound by use of hydrolysis, so that chemical compositions can be controlled accurately and the thin film is advantageous in various points of view such as uniform level of molecules, lowering in temperature in the process, increasing in area of the elements, low cost of equipments, and so on.

What is claimed is:

1. An oriented multi-layer ferrodielectric substance thin film comprising:

a first ferrodielectric substance layer of oriented crystals of a ferrodielectric substance, obtained from a metal alkoxide or metallic salt of an element selected from the group consisting of Li, K, Nb, Ta, Bi, Ba, Sr, Pb, La, Ti, and Zr, said crystals being epitaxially formed on a monocrystal substrate formed of a material selected from the group consisting of sapphire, spinel MgO, ZnO and $SrTiO_3$, said first ferrodielectric substance layer having a refractive index equivalent to that of a monocrystal of the substance forming the first ferrodielectric substance layer and a first density, but having a surface which is not optically smooth; and a second ferrodielectric substance layer of oriented crystals of a ferrodielectric substance, obtained from a metal alkoxide or metallic salt of an element selected from the group consisting of Li, K, Nb, Ta, Bi, Ba, Sr, Pb, La, Ti, and Zr, and epitaxially formed on said first ferrodielectric substance layer, said second ferrodielectric substance layer having a density lower than that of said first ferrodielectric substance layer, but having a surface which is optically smooth.

2. The multi-layer thin film of claim 1, wherein each of said first and second ferrodielectric substance layers comprises a plurality of epitaxial ferrodielectric substance layers.

3. The multi-layer thin film of claim 1, wherein said first and second ferrodielectric substance layers are constituted of the same ferrodielectric substance.

4. The multi-layer thin film of claim 1, wherein said first and second ferrodielectric substance layers are constituted of different ferrodielectric substances.

5. The multi-layer thin film of claim 1, wherein said second ferrodielectric layer has a refractive index lower than that of a monocrystal of the substance forming the second ferrodielectric substance layer.

* * * * *